(12) United States Patent
Miyahara et al.

(10) Patent No.: US 7,070,654 B2
(45) Date of Patent: Jul. 4, 2006

(54) SCREEN PRINTING APPARATUS

(75) Inventors: Seiichi Miyahara, Kurume (JP); Tetsuya Tanaka, Kurume (JP); Yuji Ootake, Fukuoka (JP); Tamotsu Sakai, Dazaifu (JP); Masayuki Mantani, Tosu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 17 days.

(21) Appl. No.: 10/898,832

(22) Filed: Jul. 26, 2004

(65) Prior Publication Data

US 2005/0022733 A1 Feb. 3, 2005

(30) Foreign Application Priority Data

Jul. 28, 2003 (JP) ............................. 2003-280730

(51) Int. Cl.
*B05B 15/00* (2006.01)
(52) U.S. Cl. ...................................... 118/302; 118/301
(58) Field of Classification Search ................ 101/114, 101/119, 120, 123, 124, 129; 118/302, 406, 118/712, 301, 429; 239/139, 132–135; 222/146.2, 222/146.4, 386, 386.5
See application file for complete search history.

(56) References Cited

U.S. PATENT DOCUMENTS

| | | | | |
|---|---|---|---|---|
| 4,332,543 A | * | 6/1982 | Fulton et al. | ............... 425/461 |
| 5,520,739 A | * | 5/1996 | Frazzitta | ..................... 118/667 |
| 6,355,104 B1 | * | 3/2002 | Polster | ...................... 118/666 |
| 2001/0047864 A1 | | 12/2001 | Sloan et al. | |

FOREIGN PATENT DOCUMENTS

WO 00/48837 8/2000

* cited by examiner

*Primary Examiner*—Brenda A. Lamb
(74) *Attorney, Agent, or Firm*—Pearne & Gordon LLP

(57) ABSTRACT

In a screen printing apparatus which prints solder cream on a substrate by a closed type squeeze head, in print space 35 that houses the solder cream 5 pressurized in a paste storing part and brings the solder cream 5 into contact with a surface of a mask plate, a hollow heat regulating member 37 provided in a horizontal direction orthogonal to a squeezing direction is caused to pass, and a heat regulating medium is circulated inside the heat regulating member 37 by a heat regulator 40, whereby the solder cream 5 in the print space 35 can be always kept at an appropriate temperature and at an appropriate viscosity, so that print quality can be secured.

7 Claims, 5 Drawing Sheets

SCREEN PRINTING APPARATUS

BACKGROUND OF THE INVENTION

The present invention relates to a screen printing apparatus which prints paste such as solder cream or conductive paste on a substrate.

In an electronic parts mounting process, as methods of printing paste such as solder cream or conductive paste on a substrate, screen printing has been used. In this method, a mask plate in which pattern holes are provided according to portions of printing is set on the substrate, and the paste is printed on the substrate through the pattern holes of the mask plate by squeezing.

As squeezing methods of this screen printing, a method using a closed-type squeeze head has been known (for example, refer to PCT WO00/48837). This method is different from the usual screen printing in that the paste is not supplied directly on the mask plate but a squeeze head provided with a paste storing container is used. In this method, in a state where an opening provided in the lower surface of the paste storing container is brought into contact with the mask plate, the paste in the paste storing container is pressurized thereby to be pushed into the pattern hole of the mask plate through the opening. By sliding the squeeze head on the mask plate, the paste is applied into each pattern hole in order.

In the screen printing using the above closed-type squeeze head, the paste in the squeeze head is always in a state where it is shut off from the outside. Accordingly, in a process of repeating the squeezing operation, the temperature of the paste in the squeeze head tends to increase. Therefore, the temperature of the paste increases with passage of time, and its viscosity changes, so that there is a problem that appropriate rolling flow is obstructed in squeezing and bad printing is easy to be produced.

SUMMARY OF THE INVENTION

Therefore, it is an object of the invention to provide a screen printing apparatus which can keep paste inside a squeeze head at an appropriate temperature and can secure print quality.

A screen printing apparatus of the invention, which moves a squeeze head on a mask plate thereby to print paste on a substrate through a pattern hole of a mask plate, includes a horizontally moving unit that moves the squeeze head to the mask plate horizontally, a lift unit that lifts and lowers the squeeze head in relation to the mask plate, and a press unit that presses the squeeze head on the mask plate. The squeeze head comprises a printing part coupled to the press unit; a paste storing part that is provided for this printing part and stores paste therein; a paste pressing part that pressurizing the paste in this paste storing part; a print space that houses the pressurized paste therein and brings the paste into contact with a surface of the mask plate; two squeezing members that form front and back walls in the squeezing direction of this print space, and come into contact with the surface of the mask plate at their lower ends; and a hollow heat regulating member that is provided in the print space in the horizontal direction orthogonal to the squeezing direction. A heat regulating medium is caused to flow inside this heat regulating member by a heat regulating unit, whereby the paste in the print space is kept at an appropriate temperature.

According to the invention, the hollow heat regulating member is provided in the print space of the squeeze head in the direction orthogonal to the squeezing direction, and the heat regulating medium is caused to flow inside this heat regulating member by the heat regulating unit, whereby the paste in the print space is kept at an appropriate temperature, and print quality can be secured.

DETAILED DESCRIPTION OF THE PREFERRED EMBODIMENTS

Next, an embodiment of the invention will be described with reference to drawings.

Figure 1:
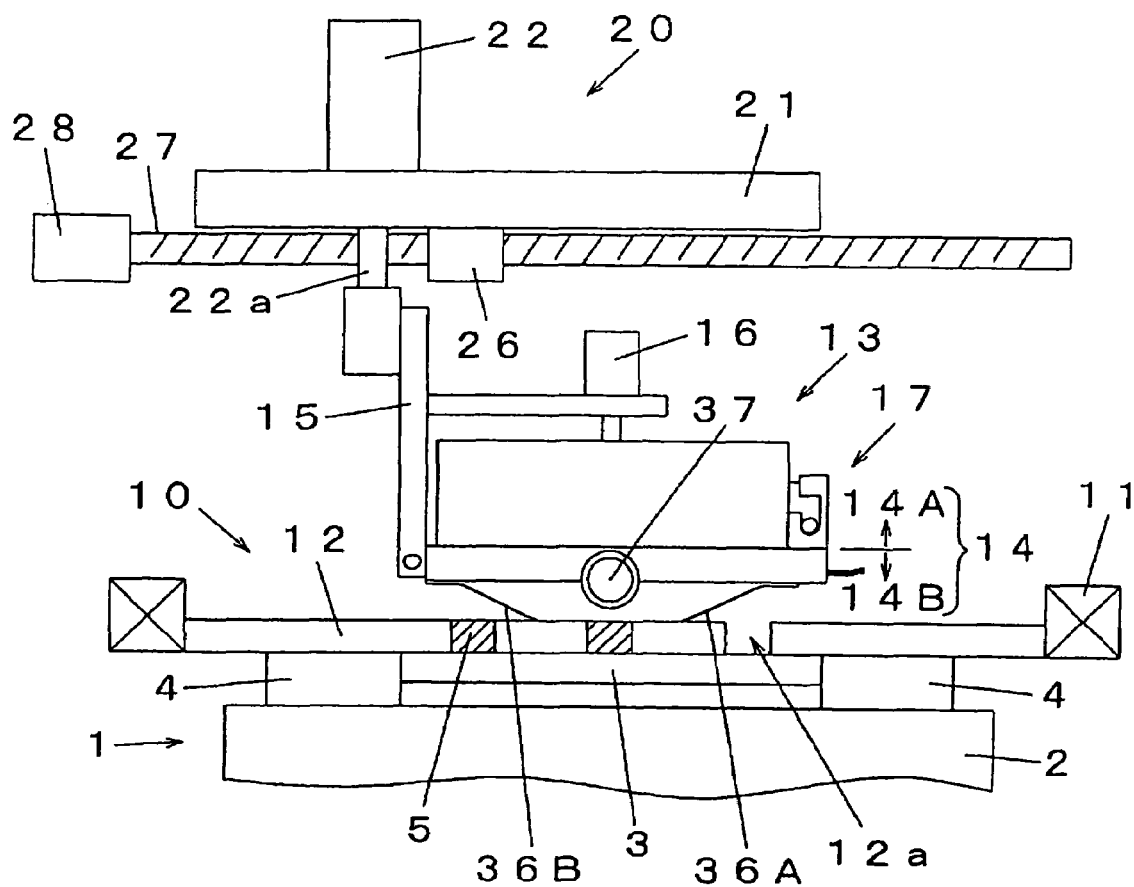
FIG. 1 is a front view of a screen printing apparatus according to one embodiment of the invention.
Figure 2:
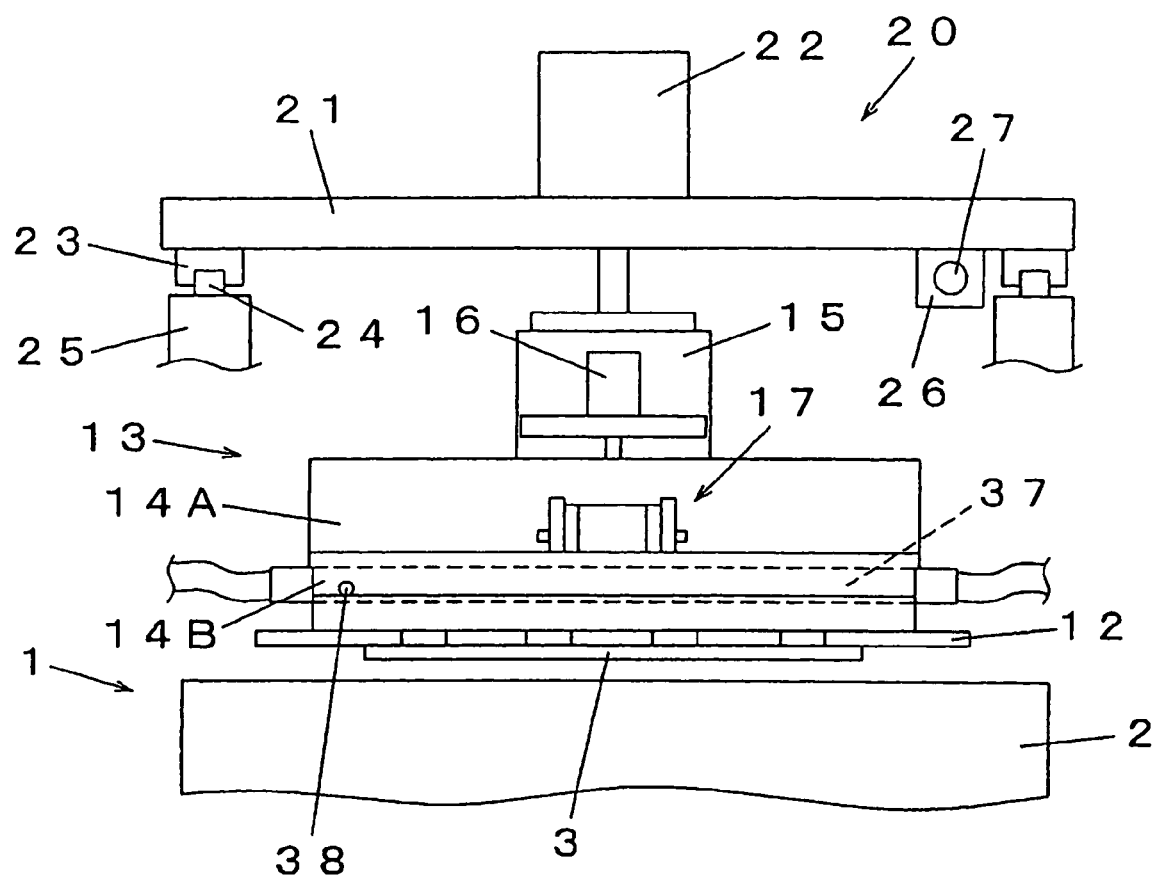
FIG. 2 is a side view of the screen printing apparatus according to one embodiment of the invention.

Referring first to FIGS. 1 and 2, the structure of the screen printing apparatus will be described. In FIGS. 1 and 2, a positioning part 1 of a substrate is composed of a substrate holding part 2 arranged on a not-shown moving table. A substrate 3 that is an object of screen printing is held by dampers 4 of the substrate holding part 2, and by driving the not-shown moving table, the substrate 3 held by the substrate holding part 2 is positioned in a horizontal direction and in an up-down direction.

Above a screen mask 10, a squeeze head 13 is arranged so that it can rise and fall by a head lifting part 20. The head lifting part 20 includes a cylinder 22 standing on a base member 21. To a lower end of a rod 22a of the cylinder 22, the squeeze head 13 is coupled through a coupling member 15. By driving the cylinder 22, the squeeze head 13 rises and falls in relation to a mask plate 12. The head lifting part 20 functions as a lift unit that lifts and lowers the squeeze head 13 in relation to the screen mask 10.

To both ends on a lower surface of a plate member 21 of the head lifting part 20, sliders 23 are fixed, and the slider 23 is slidably fitted to a guide rail 24 provided on the upper surface of a frame 25. Further, onto the lower surface of the plate member 21, a nut member 26 is coupled, and a feed screw 27 screwed in the nut 26 is driven and rotated by a motor 28.

By driving the motor 28, the plate member moves horizontally, so that the squeeze head 13 coupled to the head lifting part 20 also moves horizontally. In a state where the squeeze head 13 is lowered, by driving the motor 28, the squeeze head 13 moves on the mask plate 12 horizontally. Namely, the motor 28, the feed screw 27, and the nut 26 function as horizontally moving units that move the squeeze head 13 on the mask plate 12 horizontally.

Figure 3:
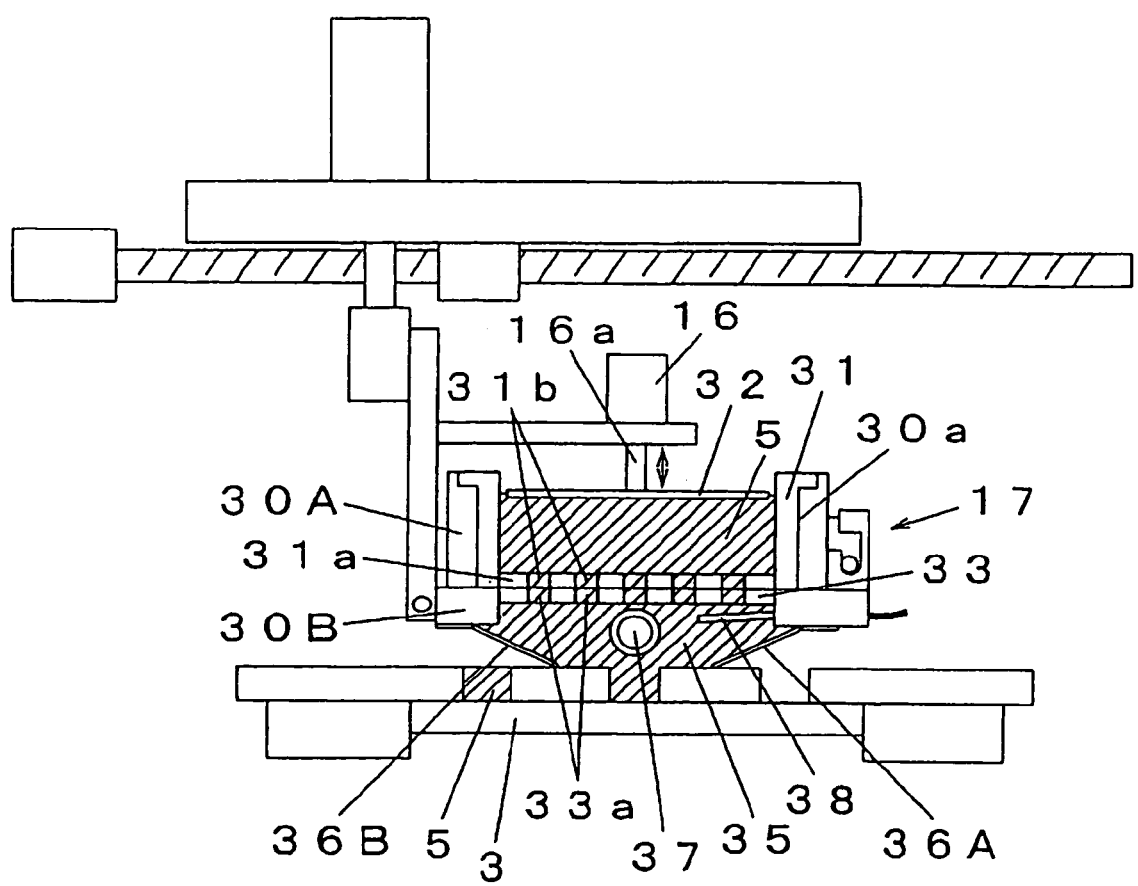
FIG. 3 is a partially sectional view of a squeeze head of the screen printing apparatus according to one embodiment of the invention.

For the squeeze head 13, a printing part 14 is provided, which comes into contact with a surface of the mask plate 12 thereby to fill a pattern hole 12a with a solder cream 5 that is paste. The printing part 14, as shown in FIG. 1, is divided into an upper part 14A and a lower part 14B. The upper part 14A and the lower part 14B, as shown in FIG. 3, have respectively a body upper part 30A and a body lower part 30B, which are block-shaped members that are slender in the width direction of the mask plate 12. Dimensions in lengths of the body upper part 30A and the body lower part 30B are set so as to cover a dimension in width of the substrate 3 that is the object of printing. The body upper part 30A and the body lower part 30B are coupled by a hinge part 17 openably and closably.

As shown in FIG. 3, in the body upper part 30A, a recess part 30a to which a cartridge 31 storing the solder cream 5 is removably attached is formed. The cartridge 31 is a storing part (paste storing part) of solder cream in which the predetermined amount of solder cream is previously stored, and it is attached to the body upper part 30A in the printing time. Into an opening on the upper surface of the cartridge 31, a pressure plate 32 that pressurizes the solder cream 5 inside the cartridge 31 is fitted. The pressure plate 32 is coupled to the rod 16a of the cylinder 16 arranged upward, and by driving the cylinder 16, the pressure plate 32 moves up and down in the cartridge 31.

Further, a bottom surface of the cartridge 31 functions as a push-out plate 31a of the solder cream, and a plurality of openings 31b are provided in the push-out plate 31a. By pressing the pressure plate 32 downward by the cylinder 16, the solder cream 5 in the cartridge 31 is pressurized and pushed out downward through the opening parts 31b of the push-out plate 31a. The cylinder 16 and the pressure plate 32 function as pressure units for pressurizing the paste 5.

For the body lower part 30B, an adhesion preventing plate 33 is provided, which comes into contact with the push-out plate 31a located at the bottom of the cartridge 31. In the adhesion preventing plate 33, an opening part 33a is provided in a position corresponding to the opening part 31b of the push-out plate 31a. The adhesion preventing plate 33 prevents the solder cream 5 pushed out downward from the cartridge 31 from adhering onto other parts than the opening part 31b located on the bottom surface of the cartridge 31, that is, on the lower surface of the push-out plate 31a.

When the solder cream 5 is pushed out by the cylinder 16, it moves downward through the push-out plate 31a and the opening part 33a of the adhesion preventing plate 33. Then, the pushed-out solder cream 5 reaches a space formed downward of the body lower part 30B, that is, a print space 35 surrounded by two squeezing members 36A, 36B provided on the lower surface of the body lower part 30B in inward diagonal directions and the lower surface of the body lower part 30B. Both side surfaces of the print space 35 are blocked by block members (not shown).

The squeezing members 36A and 36B form front and back walls in the squeezing direction of the print space 35. In a state where the squeeze head 13 is lowered, the lower end parts of the squeezing members 36A, 36B come into contact with the surface of the mask plate 12. In the printing operation, this print space 35 houses the pressurized solder cream 5, and brings the solder cream 5 into contact with the surface of the mask plate 12 through a printing surface between the squeezing members 36A and 36B.

The solder cream 5 in the cartridge 31 is pressurized by pressing down the pressure plate 32 thereby to moves through the push-out plate 31a and the adhesion preventing plate 33 into the print space 35. In the middle of the moving passage of this solder cream 5, a sectional area is narrowed down by the many small openings 31b and 33a. The pressurized solder cream 5 passes through these openings, whereby viscosity of the solder cream 5 lowers, and is improved to properties suitable for screen printing.

Figure 4:
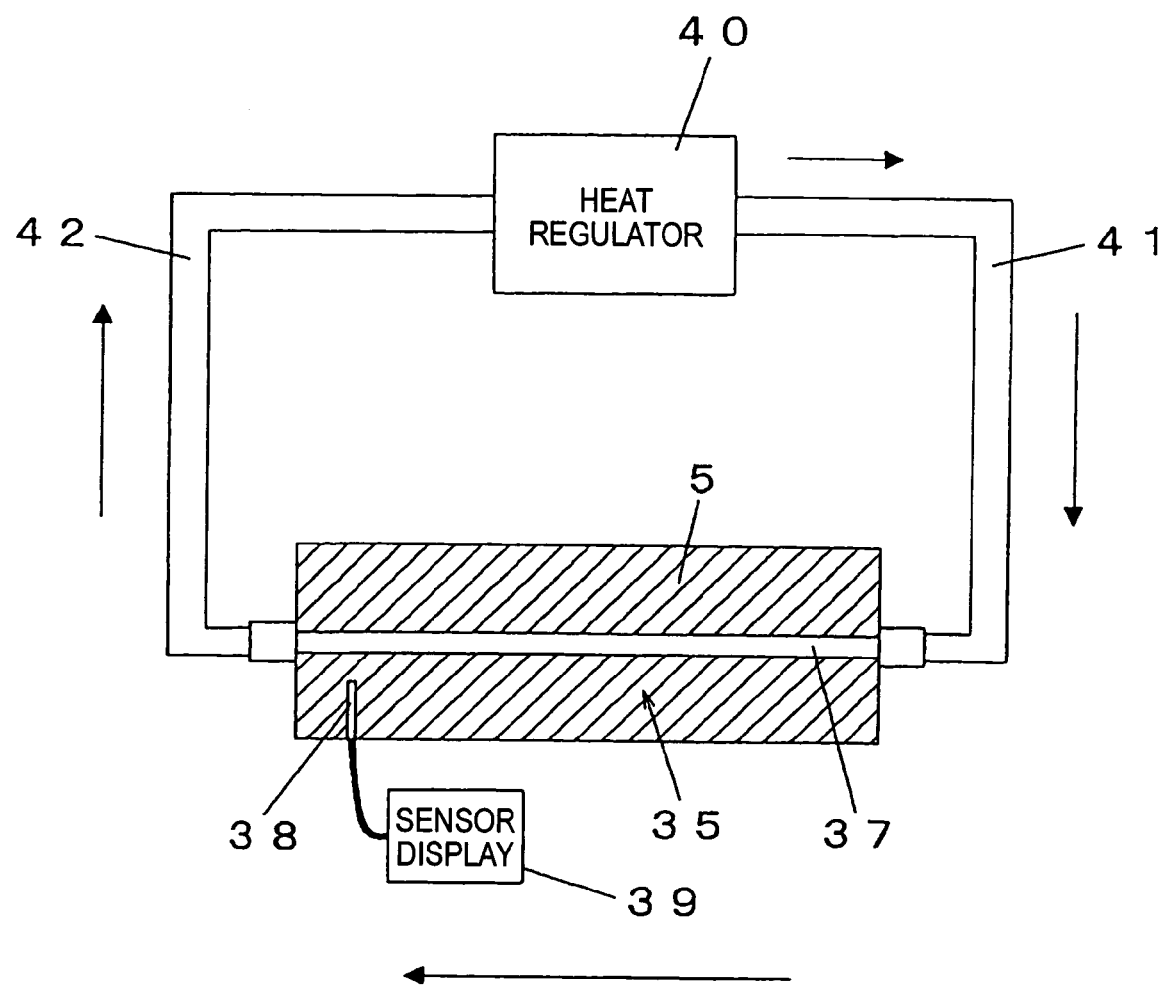
FIG. 4 is a circuit diagrams showing a heat regulating function of the squeeze head of the screen printing apparatus according to one embodiment of the invention.

As shown in FIGS. 2 and 3, a hollow tube-shaped heat regulating member 37 that passes through the print space 35 in the longitudinal direction (in left and right directions in FIG. 2) is provided for the printing part 14 in a horizontal direction orthogonal to the squeezing direction. Further, the heat regulating member 37 is arranged above the printing surface between the squeezing members 36A and 36B. The heat regulating member 37, as shown in FIG. 4, is connected to a heat regulator 40 (heat regulating unit) through piping 41, 42. A circulating circuit is formed, in which when the screen printing apparatus operates, a heat regulating medium such as water flows from the heat regulator 40 through the piping 41 into the heat regulating member 37, and returns from the piping 42 to the heat regulator 40.

Since the solder cream 5 in the squeeze head 13 is always in a state where it is shut off from the outside, the temperature of the solder cream 5 in the head tends to increase in a step of repeating the squeezing operation. Therefore, the temperature of the solder cream 5 increases with passage of time, and its viscosity changes, so that appropriate rolling flow is obstructed in squeezing and bad printing is easy to be produced. In this case, by circulating the heat regulating medium in the heat regulating member 37, the solder cream 5 in the print space 35 is kept at the appropriate temperature, and the viscosity of the solder cream 5 is kept appropriate.

Into the print space 35, a heat sensor 38 is inserted, and a result of the temperature detected by the heat sensor 38 is displayed in a sensor display 39. An operator observes this display temperature and regulates a set temperature of the heat regulator 40, whereby the temperature of the solder cream 5 in the print space 35 can be kept at the desirable temperature. The result of the temperature detected by the heat sensor 38 may be fed back to a temperature setting function of the heat regulator 40 thereby to perform heat regulation automatically.

By the squeezing operation for moving the squeeze head 13, the pattern hole 12a of the mask plate 12 is filled with the solder cream 5 in the print space 35 that is kept at the appropriate temperature and at the appropriate viscosity through the opening part between the squeezing members 36A and 36B into the. Thereafter, the movement of the squeeze head 13 is continued, whereby each pattern hole 12a is filled with the solder cream 5 in order. When all the pattern holes 12a have been filled with the solder creams 5, the substrate holding part 2 is lowered thereby to perform print separation.

Namely, the solder cream 5 into the pattern hole 12a lowers together with the substrate 3 and separates from the pattern 12a, whereby solder cream printing on the substrate 3 is completed. In this screen printing, the solder cream 5 is kept at the appropriate viscosity by the heat regulation using the heat generating member 37, and fluidity of the solder cream is secured. Therefore, good filling of the solder cream into the pattern hole 12a can be secured and print quality can be kept.

At this time, the heat regulating member 37 performs the heat regulation of the solder cream 5 in the position close to the printing surface in the print space 35. Therefore, in the state where the solder cream 5 is kept at the appropriate temperature, the pattern hole 12a is filled with the solder cream. In result, compared with a type of screen printing apparatus which performs the heat regulation of the solder cream 5 in the printing part 14 from the outer surface of the printing part 14, it is possible to secure better print quality.

In the above squeezing operation, in the state where the print space is filled with the solder cream 5 pushed out 35 from the upside, when the squeeze head 13 is moved in the squeezing direction, rolling flow in which the solder cream 5 circulates up and down in the perpendicular section in the squeezing direction is induced in the solder cream 5 in the print space 35. At this time, since the heat regulating member 37 passes through the print space 35 in the horizontal direction. orthogonal to the squeezing direction, the flow in the rolling direction runs around the heat regulating member 37 and is produced more stably.

Namely, the heat regulating member 37 functions also as a rectifying member that promotes the flow in the rolling direction of the solder cream 5 in the print space 35. By this rolling flow, the solder cream 5 in the print space 35 can be always moved during the printing operation. Therefore, a staying spot of the solder cream 5 is not produced in the print space 35, but the increase of the viscosity of the solder cream 5 is prevented, so that the print quality can be secured.

Figure 5:
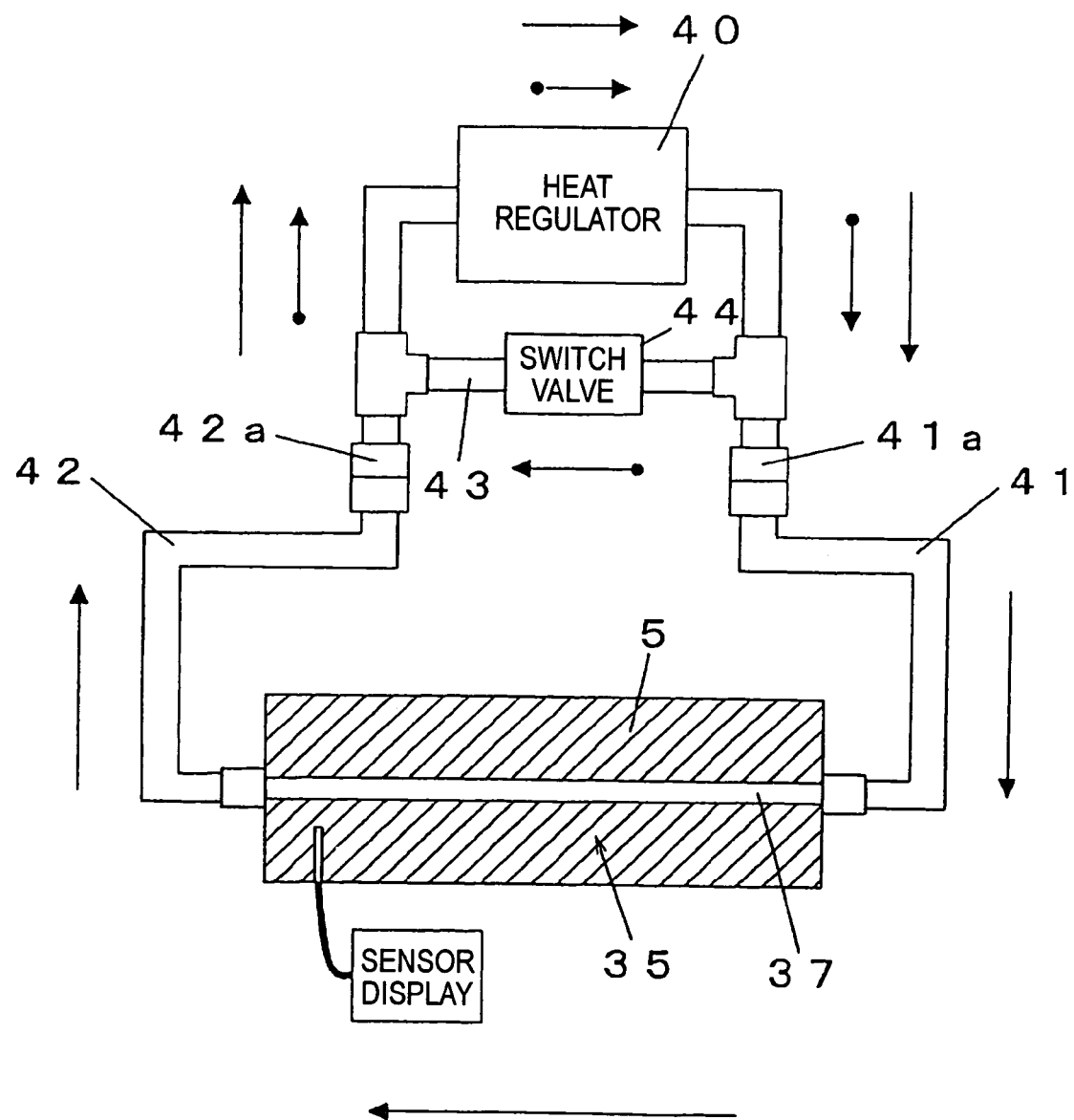
FIG. 5 is a circuit diagrams showing a heat regulating function of the squeeze head of the screen printing apparatus according to one embodiment of the invention.

FIG. 5 is a diagram showing an example in which a bypass circuit for detaching the squeeze head is provided in the above heat regulating medium circulating circuit. In this example, for the piping 41,42, couplers 41a, 42a for attaching and detaching the piping are provided. Further, for the piping 41, 42, a bypass circuit is provided by a switch valve 44 on the side closer to the heat regulator 40 than the couplers 41a, 42a. In normal operation, the switch valve 44 is closed, and the heat regulating medium flows through the piping 41 to the heat regulating member 37, and returns through the piping 42 to the heat regulator 40. In case that the squeeze head 13 must be detached for its exchange, the piping 41, 42 is cut off by the couplers 41a, 42a.

At this time, by opening the switch valve 44, in a state where the operation of the heat regulator 40 is continued, the circulating state of the heat regulating medium can be kept using the bypass circuit by the switch valve 44. Therefore, it is not necessary to stop the heat regulator 40 in the squeeze head detaching time, the heat regulating medium can be always kept at the predetermined temperature, and a waiting time when the operator stands ready till the temperature of the heat regulating medium reaches the predetermined temperature in resumption of the operation is not required.

In the above embodiment, though only one heat regulating member 37 is arranged, the plural heat regulating members may be arranged. Further, though the sectional shape of the heat regulating member 37 is a simple pipe shape, a member having fin-shaped projection on its surface or hollow members having various sections may be used in order to make heat conduction good.

Since the screen printing apparatus of the invention has the effect that the paste in the print space can be kept at the appropriate temperature and print quality can be secured, it is effective in a field of screen printing which prints paste such as solder cream or conductive paste on a substrate.

What is claimed is:

1. A screen printing apparatus, which moves a squeeze head on a mask plate thereby to print paste on a substrate through a pattern hole of a mask plate, comprising:
    a horizontally moving unit that moves said squeeze head to the mask plate horizontally;
    a lift unit that lifts and lowers said squeeze head in relation to the mask plate;
    a press unit that presses the squeeze head on the mask plate; and
    said squeeze head comprising:
        a printing part coupled to said press unit;
        a paste storing part that is provided for said printing part and stores paste therein;
        a paste pressing part that pressurizing the paste in said paste storing part;
        a print space that houses the pressurized paste therein and brings the paste into contact with a surface of the mask plate;
        two squeezing members that form front and back walls in the squeezing direction of said print space, and come into contact with the surface of the mask plate at their lower ends; and
        a hollow heat regulating member that is provided in said print space in the horizontal direction orthogonal to the squeezing direction,
    wherein a heat regulating medium is caused to flow inside said heat regulating member by a heat regulating unit, whereby the paste in said print space is kept at an appropriate temperature.

2. The screen printing apparatus according to claim 1, wherein said heat regulating member is arranged upward of a printing surface between said two squeezing members.

3. The screen printing apparatus according to claim 1, wherein said heat regulating member is used also as a rectifying member that promotes the flow in the rolling direction of the paste in said print space.

4. The screen printing apparatus according to claim 1, wherein a heat sensor that detects the temperature of the paste in said print space is provided in said print space.

5. The screen printing apparatus according to claim 4, wherein a display part that displays a result of the detected temperature by said heat sensor is provided.

6. The screen printing apparatus according to claim 1, wherein said heat regulating unit and said heat regulating member are connected to each other through piping, and they form a circulating circuit in which the heat generating medium is circulated.

7. A screen printing apparatus, which moves a squeeze head on a mask plate thereby to print paste on a substrate through a pattern hole of a mask plate, comprising:
    a horizontally moving unit that moves said squeeze head to the mask plate horizontally;
    a lift unit that lifts and lowers said squeeze head in relation to the mask plate;
    a press unit that presses the squeeze head on the mask plate; and
    said squeeze head comprising:
        a printing part coupled to said press unit;
        a paste storing part that is provided for said printing part and stores paste therein;
        a paste pressing part that pressurizing the paste in said paste storing part:
        a print space that houses the pressurized paste therein and brings the paste into contact with a surface of the mask plate;
        two squeezing members that form front and back walls in the squeezing direction of said print space, and come into contact with the surface of the mask plate at their lower ends; and
        a hollow heat regulating member that is provided in said print space in the horizontal direction orthogonal to the squeezing direction,
    wherein a heat regulating medium is caused to flow inside said heat regulating member by a heat regulating unit, whereby the paste in said print space is kept at an appropriate temperature,
    wherein said heat regulating unit and said heat regulating member are connected to each other through piping, and they form a circulating circuit in which the heat generating medium is circulated,
    wherein said circulating circuit is provided with a bypass circuit for keeping the circulating state of the heat regulating medium when the squeeze head is detached.

* * * * *

UNITED STATES PATENT AND TRADEMARK OFFICE
CERTIFICATE OF CORRECTION

PATENT NO. : 7,070,654 B2  Page 1 of 1
APPLICATION NO. : 10/898832
DATED : July 4, 2006
INVENTOR(S) : Miyahara et al.

It is certified that error appears in the above-identified patent and that said Letters Patent is hereby corrected as shown below:

On the Title, item [56] Col. 2 line 4 under U.S. PATENT DOCUMENTS, please delete "2001/0047864" and insert -- 2004/0047864--.

Signed and Sealed this

Thirty-first Day of October, 2006

JON W. DUDAS
*Director of the United States Patent and Trademark Office*